(12) United States Patent
Yu et al.

(10) Patent No.: US 6,191,036 B1
(45) Date of Patent: Feb. 20, 2001

(54) USE OF PHOTORESIST FOCUS EXPOSURE MATRIX ARRAY AS VIA ETCH MONITOR

(75) Inventors: Allen S. Yu, Fremont; Paul J. Steffan, Elk Grove; Bharath Rangarajan, Santa Clara, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/290,354

(22) Filed: Apr. 12, 1999

(51) Int. Cl.$^7$ .................................................. H01L 21/302
(52) U.S. Cl. ............................................. 438/689; 430/5
(58) Field of Search ..................... 438/689; 356/390–394, 356/399–401; 430/5

(56) References Cited

U.S. PATENT DOCUMENTS

| | | | |
|---|---|---|---|
| 5,805,290 | * | 9/1998 | Ausschnitt et al. ................... 356/401 |
| 5,960,107 | * | 9/1999 | Leroux ................................. 382/145 |
| 5,965,306 | * | 10/1999 | Mansfield et al. ..................... 430/22 |

* cited by examiner

*Primary Examiner*—Robert Kunemund
*Assistant Examiner*—Kin-Cha Chen
(74) *Attorney, Agent, or Firm*—H. Donald Nelson

(57) ABSTRACT

A method of predicting etch efficacy of vias in a semiconductor manufacturing process wherein a photo focus exposure matrix (FEM) array is used as a via etch monitor. The FEM is an array of matrices wherein each array has a different size set of vias. The matrices in the array start with a size approximately double the minimum dimension of vias in the wafer and decrement in size to a size approximately half the minimum dimension.

4 Claims, 3 Drawing Sheets

USE OF PHOTORESIST FOCUS EXPOSURE MATRIX ARRAY AS VIA ETCH MONITOR

BACKGROUND OF THE INVENTION

1. Field of the Invention

This invention relates generally to the manufacture of high performance semiconductor devices. More specifically, this invention relates to a method of monitoring an etch monitor structure that would predict the etch quality of the semiconductor manufacturing process. Even more specifically, this invention relates to a method of using an array of photo focus exposure matrices to predict the etch quality of the semiconductor manufacturing process.

2. Discussion of the Related Art

In order to remain competitive, a semiconductor manufacturer must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also known as die) from each wafer is not 100% because of defects incurred during the manufacturing process. The number of good chips obtained from a wafer determines the yield. As can be appreciated, chips that must be discarded because of a defect increases the cost of the remaining usable chips.

A single semiconductor chip can require numerous process steps such as oxidation, etching, metallization and wet chemical cleaning. Some of these process steps involve placing the wafer on which the semiconductor chips are being manufactured into different tools during the manufacturing process. The optimization of each of these process steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits.

Modern very large-scale monolithic silicon devices require many millions of transistors for high performance operation. These millions of transistors must all maintain full functionality for the device to operate properly. This requires that every transistor must not only be formed without error but also that they retain the ability to be interconnected to virtually any other transistor on the device. This interconnectivity is accomplished through multiple vias through multiple interlayer dielectrics. The typical method of forming vias is to deposit a layer of photoresist on a layer of interlayer dielectric material, exposing the photoresist, and developing the photoresist. This series of processes exposes portions of the metal layer underlying the interlayer dielectric on which the vias are to be formed.

One inherent problem with this method of forming vias is the difficulty of discerning whether all of the vias are open to the bottom of the interlayer dielectric during the etch process. In an environment in which even one partially etched via can degrade device performance or even cause the device to fail (kill the device) it is critical to have a reliable method of determining when the true end-of-etch has been reached. Due to natural variations in process, including variations in etch rate, variations in the thickness of the interlayer dielectric, a pilot wafer is usually processed and inspected prior to committing the rest of the wafers in the manufacturing lot. The inspection of the pilot wafer is necessarily done in a SEM (scanning electron microscope) and is a time consuming process preventing the further processing of the remaining wafers in the lot. The selection of the pilot wafer is a random sample, which yields inspector dependent subjective or qualitative results.

There currently exists an array of photo focus exposure matrices (FEM) that aid in monitoring the focus, exposure and development process integrity. The matrices are a sequence of via dot array test patterns migrating down in size from about double the minimum dimension to half the minimum dimension at 0.05 $\mu$m decrements. These patterns provides the DI (develop inspect) inspector a tool to quickly determine whether the current process is defining the mask to the wafer properly. These patterns are also available to the A/E (after etch inspect) inspector and the FI (final inspect) inspector.

The inventors have extensively studied the patterns in relation to the overall etch integrity and have determined that there is a correlation for each increment of via dots to the overall etch integrity. Due to the aspect ratio etch dependency phenomenon, the next smaller dimension of via dots etches slower than the previous dimension, resulting in an incomplete etch of the via to the bottom of the layer of the interlayer dielectric. In lithography, the dots take longer to expose and open to the bottom of the layer of the interlayer dielectric. The inventors have discovered that closed and incomplete vias are usually accompanied with shallow or missing via dots in the next incremental matrix in the array of matrices in the FEM. At the pre-etch level, when the via dots have low contrast, the vias do not open to the surface of the underlying metal layer. The same phenomenon happens at the post resist strip level. This "forward looking" technique can also apply to the pre-etch level where two increments of complete matrix of dots will be used without stripping the photoresist mask. This corresponds to one decrement from after etch to post strip.

Therefore, what is needed is an etch monitor structure that can be inspected optically and evaluated quantitatively to predict etch efficacy.

SUMMARY OF THE INVENTION

According to the present invention, the foregoing and other objects and advantages are attained by a method of predicting etch efficacy of vias in a semiconductor manufacturing process by using a photo focus exposure matrix (FEM) array as a via etch monitor.

In accordance with an aspect of the invention, the FEM array is inspected, a matrix in the array having incomplete via dots is identified and determining the etch efficacy of a via dimension by decrementing two sizes from the matrix that has incomplete via dots.

In accordance with another aspect of the invention, each of the matrices have a different size starting with a size approximately double the minimum dimension of vias in the semiconductor wafer and decrementing by approximately 0.05 $\mu$m to a size approximately half the minimum dimension.

In accordance with still another aspect of the invention, the FEM array is electronically inspected and the inspection data is sent to an electronic interface.

In accordance with another aspect of the invention, the etch recipe for the subsequent etch process is adjusted using the inspection data from the electronic interface.

The method of the invention is an accurate method of predicting the efficacy of vias that will be formed in the wafer and for avoiding the necessity for reworking the wafer lot when a defective photoresist development process has been detected during the inspection of the FEM.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
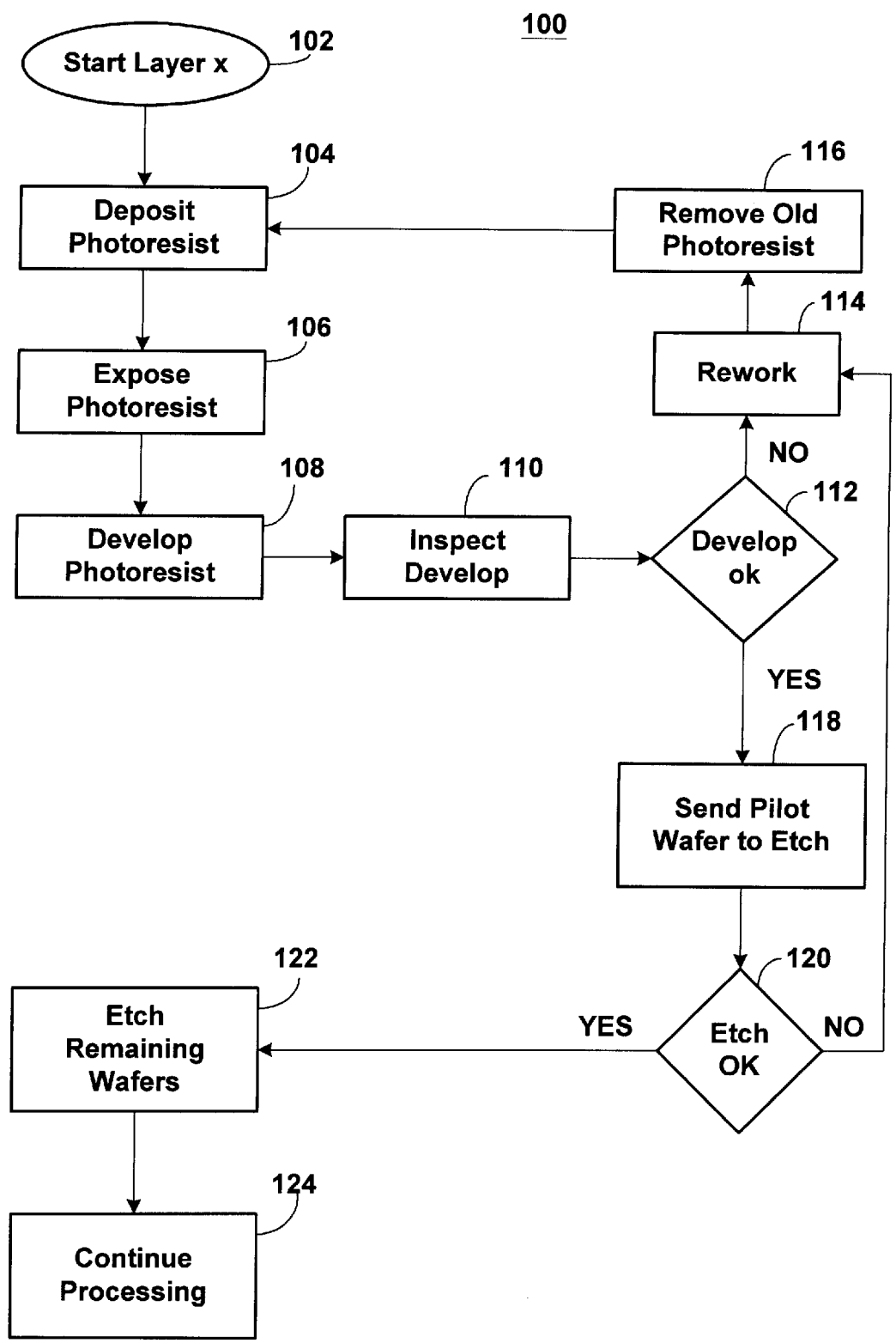
FIG. 1 is a flow diagram of a portion of a manufacturing process showing a prior art method of forming vias including a step of inspecting the development of the photoresist.

FIG. 1 is a flow diagram of a portion 100 of a manufacturing process showing a method of forming vias. The portion 100 of the manufacturing process includes inspecting the development of the photoresist to determine whether a metal layer underlying a layer of interlayer dielectric is sufficiently exposed in order that viable vias can be formed. The portion 100 of the manufacturing process repeats for each layer of the semiconductor wafer, however, the process will be described for only one layer. The portion 100 of the manufacturing process begins with a layer x, as indicated at 102. In order to form a via through a layer of interlayer dielectric to an underlying metal layer, a layer of photoresist is deposited on the layer of interlayer dielectric, as indicated at 104. The photoresist is patterned with the locations at which vias are to be formed in the layer of interlayer dielectric and exposed by illumination, as indicated at 106. The photoresist is developed by an appropriate chemical bath, as indicated at 108. After the photoresist is developed, an inspection of the vias is conducted at 110 to determine if all the vias are open or likely to be open. As can be appreciated, because there are likely to be thousands if not millions of vias on a wafer, it is impossible to inspect each and every via to see if they are all open to the underlying metal layer. As a result only some of the vias are inspected on a randomly selected test wafer. It is determined at 112 if the develop is ok. If the inspected vias appear not to be open (develop not ok) to the underlying metal layer, the manufacturing lot is reworked, as indicated at 114. The defective photoresist layer is removed from the entire manufacturing lot of wafers, as indicated at 116. The wafers are then sent back to step 104 of the process.

If the photoresist development is determined to be good at 112, a pilot wafer is sent through the etch process, as indicated at 118. After the etch process on the pilot wafer is completed, the pilot wafer is inspected to determine if the etch process is ok, as indicated at 120. If the etch process on the pilot wafer is not good, the wafer lot is sent to rework 114, the old layer of photoresist is removed, as indicated at 116, and the wafers are sent back through the process at 104. If the etch process on the pilot wafer is good, the remaining wafers in the manufactured lot are etched, as indicated at 122. After the remaining wafers are etched, the wafers are further processed, as indicated at 124.

Figure 2:
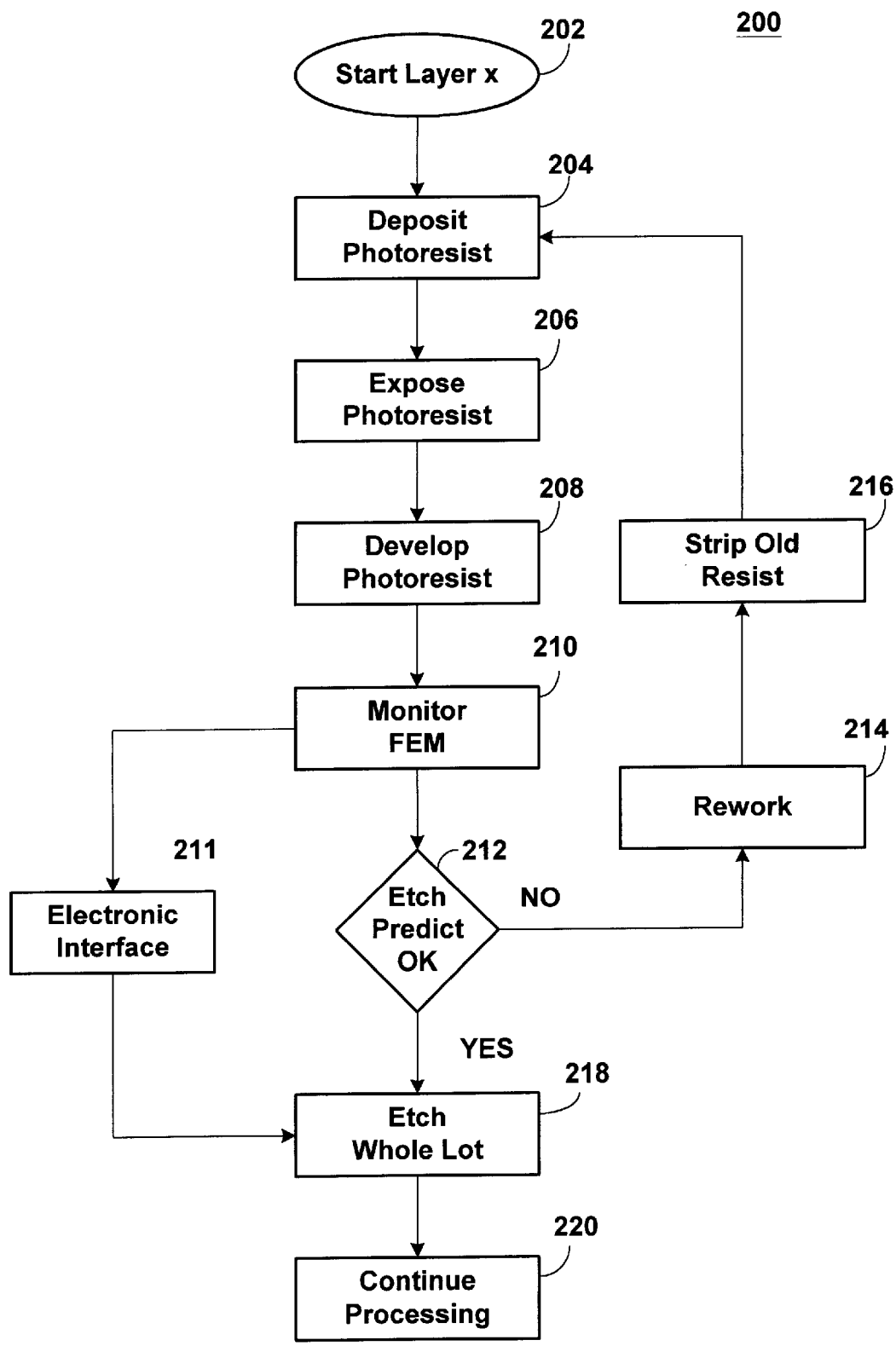
FIG. 2 is a flow diagram of portion of a manufacturing process showing a method of forming vias including a method of inspecting an array of photo focus exposure matrices (FEM) to predict the efficacy of a subsequent etch process.

FIG. 2 is a flow diagram of a portion 200 of a manufacturing process showing a method of forming vias in accordance with the present invention. The portion 200 of the manufacturing process includes a method of inspecting an array of photo focus exposure matrices (FEM) to predict the efficacy of a subsequent etch process. The portion 200 of the manufacturing process repeats for each layer of the semiconductor wafer, however, the process will be described for only one layer. The portion 200 of the manufacturing process begins with a layer x, as indicated at 202. In order to form a via through a layer of interlayer dielectric to an underlying metal layer, a layer of photoresist is deposited on the layer of interlayer dielectric, as indicated at 204. The photoresist is patterned with the locations at which vias are to be formed in the layer of interlayer dielectric and exposed by illumination, as indicated at 206. The photoresist is developed by an appropriate chemical bath, as indicated at 208. After the photoresist is developed, an array of photo focus exposure matrices (FEM) is inspected, at 210, to predict the efficacy of a subsequent etch process. The array of photo focus exposure matrices is inspected electronically and the inspection data is sent to an electronic interface unit 211. The electronic interface unit 211 analyzes the inspection data and, if necessary calculates data to adjust the etch recipe for the subsequent etch process. The ability to adjust the etch recipe providesa method to avoid a reworking step in some cases. In contrast to prior art methods, the wafer lot would, in all cases, have to be reworked if the visual inspection of the wafer indicated that a subsequent etch process would not be 100% successful. The ability to adjust the etch process provides a unique ability to avoid the necessity of reworking the entire manufacturing lot. The problem with reworking the entire manufacturing lot is that the yield decreases when the lot is reworked.

If it is predicted at 212 that the subsequent etch process will not be successful in spite of the adjustment of the etch recipe, the wafer lot are reworked, as indicated at 214. The existing layer of photoresist is removed from the wafers in the lot, as indicated at 216 and the wafers are the re-entered into the manufacturing process at 204. If it is predicted at 212 that the subsequent etch process will be successful, all of the wafers in the lot are etched at 218 and the manufacturing process continues at 220.

Figure 3:
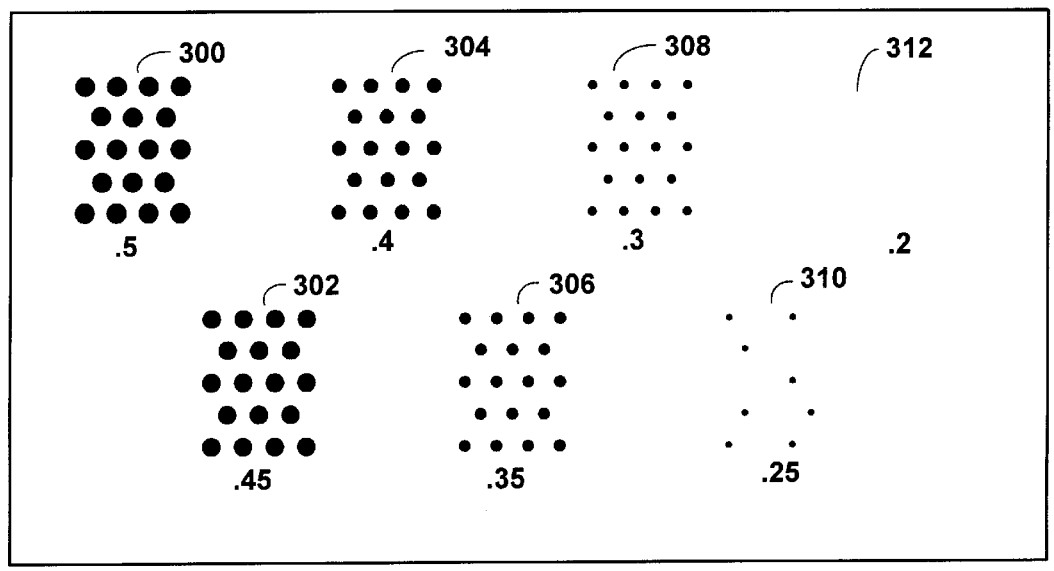
FIG. 3 depicts an array of photo focus exposure matrices (FEM) that is used to predict the efficacy of a subsequent etch process.

FIG. 3 shows an array of photo focus exposure matrices that a presently used to aid in monitoring the focus, exposure and development process efficacy. The array of matrices is a sequence of via dot array test patterns and is placed on an unused portion of the semiconductor wafer. The size of the via dots start at about double the minimum dimension of desired vias and decrease to about half the minimum dimension in 0.05 µm decrements. This pattern has been used by the DI (develop inspect) inspector as a tool to quickly determine whether the current process is defining the mask to the wafer properly. The FEM is also available to the A/E (after etch inspect) inspector and the FI (final inspect) inspector. In FIG. 3, there are shown via dots having a dimension of 0.5 µm at 300, 0.45 µm at 302, 0.4 µm at 304, 0.35 µm at 306, 0.3 µm at 308, and 0.25 µm at 310. Via dots that would have a dimension of 0.2 µm would be shown at 312, however, none of the via dots opened to the metal layer underlying the layer of interlayer dielectric. The observability of the via dots will be discussed below in conjunction with the discussion of FIGS. 4A–4D.

The inventors discovered that there is a correlation for each increment of via dots to the overall etch efficacy. Due to the aspect ratio etch dependency phenomenon, the next smaller dimension of via dots etches slower than the previous dimension, resulting in an incomplete etch of the via to the bottom of the layer of interlayer dielectric. The inventors discovered that closed and incomplete vias (not completely open to the layer of interlayer dielectric) are usually accompanied with shallow or missing via dots in the next increment of via dots. This predictive method is used to predict etch efficacy by using two decrements, that is, when there are closed and incomplete vias in one matrix, a good etch can be predicted for the size represented by two decrements from the matrix having the closed and incomplete vias. For example, in FIG. 3 there are incomplete and closed vias in the 0.25 µm via dots at 310. Therefore, in accordance with the present invention, it can be predicted that vias having a dimension of 0.35 µm at 306 (two decrements from the 0.25 µm via dots at 310) will all have a high probability of being open to the metal layer underlying the layer of interlayer dielectric.

The FEM structure can be scanned in an automated procedure, with the scanning tool be adjusted to define the proper light level/contact opening to provide the contrast level that indicates that the vias are either completely open or are sufficiently open to provide a proper subsequent etch.

Figure 4A:
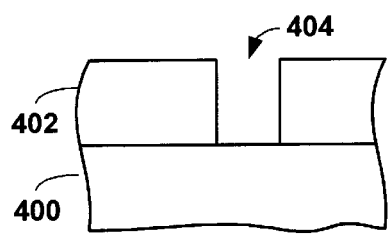
FIGS. 4A–4D are cross sectional views of vias showing various portions of the photoresist removed during a development process.
Figure 4B:
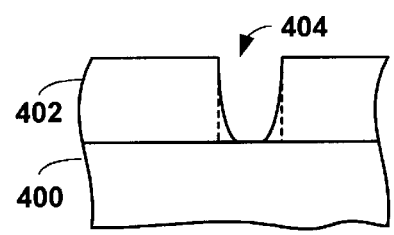
Figure 4C:
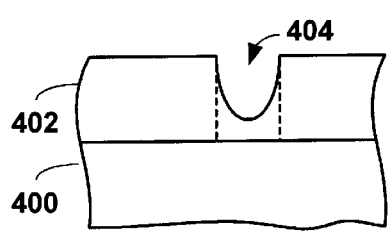
Figure 4D:
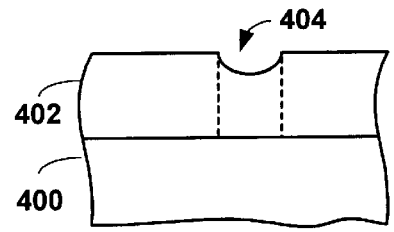

FIGS. 4A–4D show various conditions of a photoresist development process. In each of the FIGS. 4A–4D, there is shown a layer of interlayer dielectric 400 or the layer in which vias to the metal layer (not shown) are to be formed, a layer of photoresist 402 that has been subjected to a development process and an a cross-section of a via or an incomplete hole 404 that has been formed layer of photoresist 402. In FIGS. 4B–4D the outlines of the desired vias in the layer of photoresist are shown in dashed outline 406. Such vias having various dimensions make up an FEM array.

FIG. 4A shows a via 404 that has been perfectly developed and is open all the way to the surface of the layer of interlayer dielectric 400. The inspection of this via on an FEM would show a complete via dot with high contrast.

FIG. 4B shows a via 404 that is partially open all the way to the surface of the layer of interlayer dielectric 400. The inspection of this via on an FEM would show a smaller via dot with diminished contrast relative to a via dot that is completely open to the layer of interlayer dielectric 400.

FIG. 4C shows a via 404 that is incompletely developed and is not open to the layer of interlayer dielectric 400. The inspection of this via on an FEM would show very little contrast if any contrast at all.

FIG. 4D shows a via 404 that is barely developed and only shows a slight indentation of the layer 402 of photoresist. The inspection of this via on an FEM would probably not show any contrast and would be undetectable.

It should be appreciated that each of the four vias shown in FIGS. 4A–4D, if on an FEM array would have had a different dimension. For example, FIG. 4A could have been a via on an FEM array matrix having a dimension of 0.4 µm, FIG. 4B could have been a via on an FEM array matrix having a dimension of 0.35 µm, FIG. 4C could have been a via on an FEM array matrix having a dimension of 0.30 µm and FIG. 4D could have been a via on an FEM array matrix having a dimension of 0.25 µm.

The benefits of this invention are:

1. It provides a quick and each etch monitor and predictor.
2. It is an automated procedure, reduces operator dependency thus removing variability caused by different operators.
3. It provides a quantitative value for etch efficacy.
4. It provides a fast turnaround from monitor wafer to lot run.
5. It can be electronically interfaced from the lithography step to the etch step to adjust etch time.
6. It accurately predicts missing and incomplete vias.
7. The accurate predictions reduce the number of reworks.

In summary, the results and advantages of the method of predicting etch efficacy can now be more fully realized.

The method of the invention is an accurate method of predicting the efficacy of vias that will be formed in the wafer.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of predicting etch efficacy of vias in a semiconductor manufacturing process, the method comprising:

inspecting an FEM array on the surface of a semiconductor wafer after an etch process, wherein the FEM array comprises a series of matrices, wherein each matrix is a set of via dots and the size of the via dots in the array decreases in size from a matrix to a next matrix;

determining a matrix in the FEM array that has incomplete via dots in the set of via dots in that matrix;

selecting an efficacious via dimension by selecting a matrix having via dots two sizes larger than the matrix in the FEM array that has incomplete via dots.

2. The method of claim 1, wherein inspecting an array of matrices includes inspecting matrices in the FEM array having a size starting with a size approximately double the minimum dimension of vas in the semiconductor wafer and decrementing by approximately 0.05 µm to a size approximately half the minimum dimension.

3. The method of claim 2, wherein inspecting the FEM array comprises inspecting the FEM array electronically and sending inspection data to an electronic interface.

4. The method of claim 3, further comprising adjusting an etch process recipe using the inspection data in the electronic interface.

* * * * *